US009991812B2

(12) United States Patent
Chung et al.

(10) Patent No.: US 9,991,812 B2
(45) Date of Patent: Jun. 5, 2018

(54) VARIABLE BLANKING FREQUENCY FOR RESONANT CONVERTERS

(71) Applicant: FAIRCHILD KOREA SEMICONDUCTOR LTD., Bucheon (KR)

(72) Inventors: Bonggeun Chung, Siheung-si (KR); Taesung Kim, Yangcheon-gu (KR); Gwanbon Koo, Sunnyvale, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days. days.

(21) Appl. No.: 15/636,833

(22) Filed: Jun. 29, 2017

(65) Prior Publication Data

US 2018/0019677 A1     Jan. 18, 2018

Related U.S. Application Data

(60) Provisional application No. 62/361,157, filed on Jul. 12, 2016.

(51) Int. Cl.
| | |
|---|---|
| *H02M 3/315* | (2006.01) |
| *H02M 3/337* | (2006.01) |
| *H02M 3/335* | (2006.01) |
| *H02M 3/155* | (2006.01) |
| *H03J 1/00* | (2006.01) |
| *H04B 1/715* | (2011.01) |
| *H02M 3/24* | (2006.01) |

(52) U.S. Cl.
CPC ......... *H02M 3/3376* (2013.01); *H02M 3/155* (2013.01); *H02M 3/24* (2013.01); *H02M 3/335* (2013.01); *H02M 3/33507* (2013.01); *H03J 1/0091* (2013.01); *H04B 1/715* (2013.01)

(58) Field of Classification Search
CPC . H02M 3/3155; H02M 3/33507; H02M 3/335
See application file for complete search history.

(56) References Cited

U.S. PATENT DOCUMENTS

| | | | |
|---|---|---|---|
| 6,188,587 B1 * | 2/2001 | Yun ................... | H02M 3/33507 363/21.18 |
| 9,871,451 B2 * | 1/2018 | Lin .................... | H02M 3/33507 |
| 2015/0055378 A1 | 2/2015 | Lin et al. | |

* cited by examiner

*Primary Examiner* — Adolf Berhane
*Assistant Examiner* — Afework Demisse
(74) *Attorney, Agent, or Firm* — AMPACC Law Group, PLLC

(57) ABSTRACT

A power supply includes a transistor that is connected to a primary winding of a transformer. A controller controls a switching operation of the transistor by quasi-resonant switching. The controller receives a feedback voltage and adjusts the feedback voltage to adjust a blanking frequency, which is an inverse of a blanking time during which the transistor is prevented from being turned on. The controller turns on the transistor after expiration of the blanking time based on a level of a resonant ring.

20 Claims, 21 Drawing Sheets

US 9,991,812 B2

VARIABLE BLANKING FREQUENCY FOR RESONANT CONVERTERS

BACKGROUND OF THE INVENTION

1. Field of the Invention

The present invention relates generally to electrical circuits, and more particularly but not exclusively to resonant converters.

2. Description of the Background Art

A DC-DC converter includes a switch element that is switched to convert an AC source to a regulated DC output voltage. The DC-DC converter may have a flyback quasi-resonant (QR) topology that includes a resonant circuit, such as that formed by a parasitic capacitance of the switch element and an inductance of a transformer winding. In QR switching, energy is stored in the transformer when the switch element is turned on. When the switch element is turned off, the resonant circuit causes a node voltage of the switch element to ring after the energy stored in the transformer is dissipated. The switch element is turned on when the resonant ring reaches a low level, which is the valley of the resonant ring in so-called "valley switching." To prevent the switch element from inadvertently turning on, the switch element is prevented from being turned on during a blanking time.

SUMMARY

In one embodiment, a power supply includes a transistor that is connected to a primary winding of a transformer. A controller controls a switching operation of the transistor by quasi-resonant switching. The controller receives a feedback voltage and adjusts the feedback voltage to adjust a blanking frequency, which is an inverse of a blanking time during which the transistor is prevented from being turned on. The controller turns on the transistor after expiration of the blanking time based on a level of a resonant ring.

These and other features of the present invention will be readily apparent to persons of ordinary skill in the art upon reading the entirety of this disclosure, which includes the accompanying drawings and claims.

Figure 1:
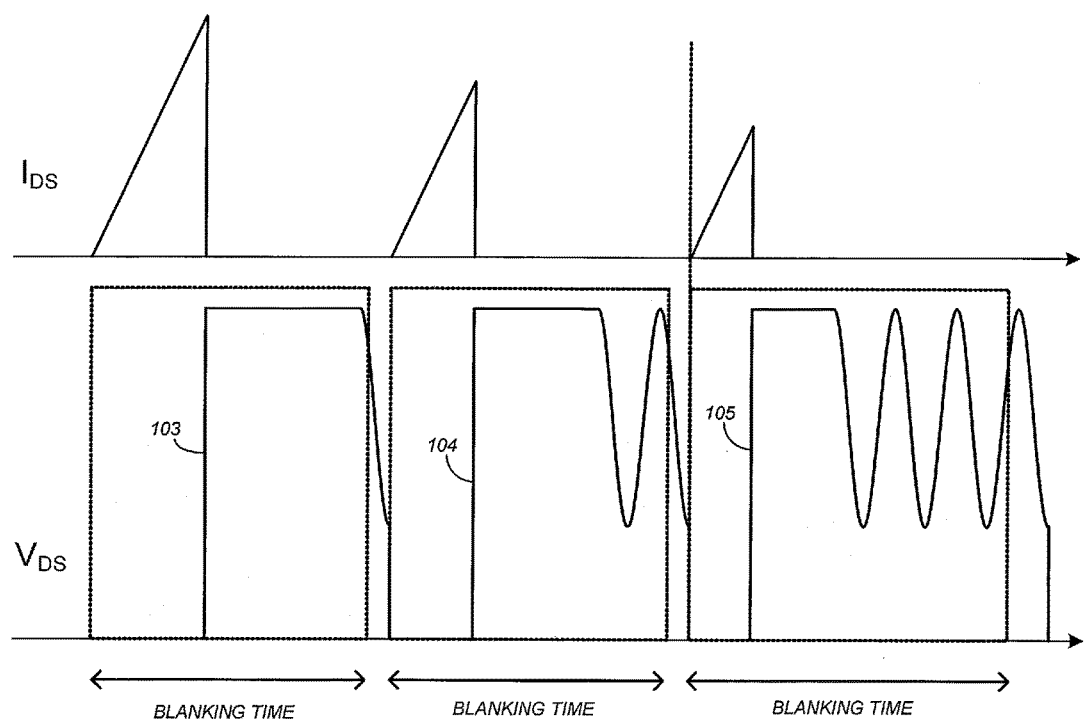
FIG. 1 shows waveforms of signals of a quasi-resonant (QR) converter.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

For ease of reading, subscripts and superscripts that appear in the drawings are formatted below as normal fonts. For example, a signal that is labeled in the drawings as $V_{EXAMPLE}$ is simply written below as VEXAMPLE.

Figure 2:
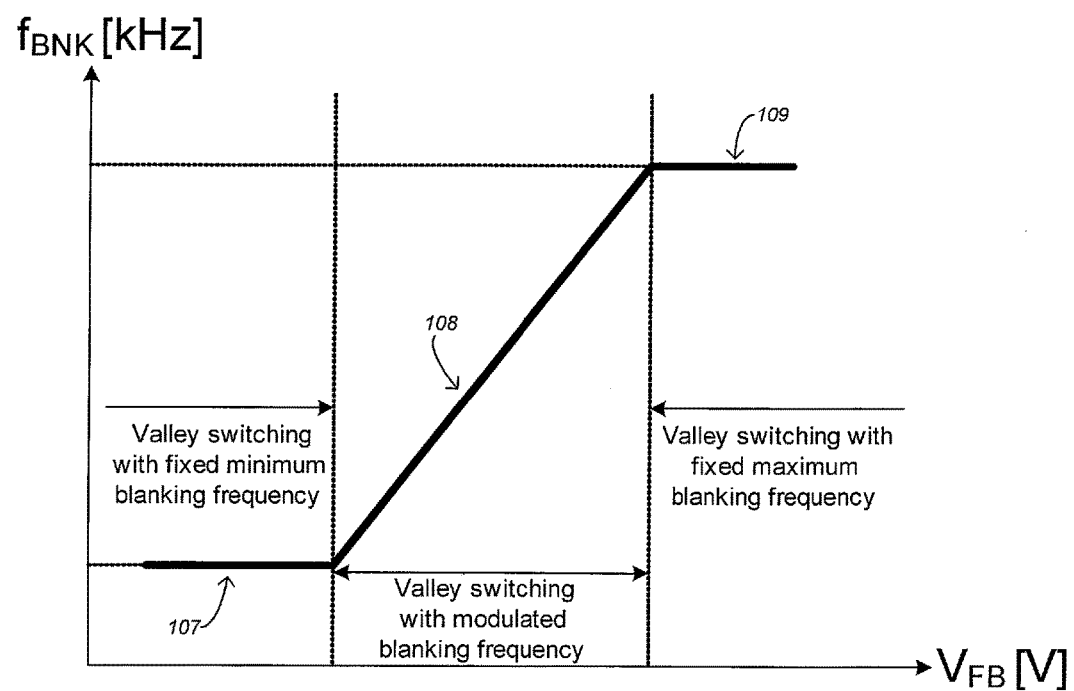
FIG. 2 shows a blanking frequency foldback curve that may be implemented by a QR controller.

FIG. 1 shows example waveforms of signals of a quasi-resonant converter with valley switching. In the example of FIG. 1, a QR controller controls a switching operation of a switch element, such as a metal oxide semiconductor field effect transistor (MOSFET). FIG. 1 shows a drain-to-source current IDS and a drain-to-source voltage VDS of the MOSFET. In the example of FIG. 1, the current IDS increases when the MOSFET is on, and decreases to zero when the MOSFET is off. At some point after the MOSFET is turned off, the voltage VDS (e.g., as detected from a drain node of the MOSFET) starts to resonant ring. The QR controller prevents the MOSFET from being turned on during a blanking time. After expiration of the blanking time, the QR controller turns on the MOSFET in response to detecting a valley (also referred to as "resonant valley") of the resonant ring. In a first case, the QR controller turns on the MOSFET at the first resonant valley after expiration of the blanking time (see VDS 103). In another case, the QR controller turns on the MOSFET at the second resonant valley after expiration of the blanking time (see VDS 104). In yet another case, the QR controller turns on the MOSFET at the fourth resonant valley after expiration of the blanking time (see VDS 105). In the example of FIG. 2, the QR controller adjusts the blanking time based on load condition.

FIG. 2 shows a blanking frequency foldback curve that may be implemented by a QR controller. A blanking frequency is the inverse of a blanking time. Generally speaking, a blanking frequency foldback curve indicates a blanking frequency for a given load. A QR controller may be configured to set the blanking frequency for a load condition based on its blanking frequency foldback curve.

In the example of FIG. 2, the blanking frequency foldback curve gives the blanking frequency (FBNK) as a function of the feedback voltage VFB, which is indicative of the load condition. In the example of FIG. 2, the feedback voltage VFB increases when the load increases, and decreases when the load decreases. The blanking frequency foldback curve for a given QR controller may be tailored to meet a particular control scheme. In the example of FIG. 2, the blanking frequency foldback curve dictates a fixed minimum blanking frequency at light loads (see arrow 107), a modulated blanking frequency at medium loads (see arrow 108), and a fixed maximum blanking frequency at heavy loads (see arrow 109). The QR controller follows the blanking frequency foldback curve by setting the blanking frequency for valley switching for a given load condition in accordance with the blanking frequency foldback curve.

Figure 3:
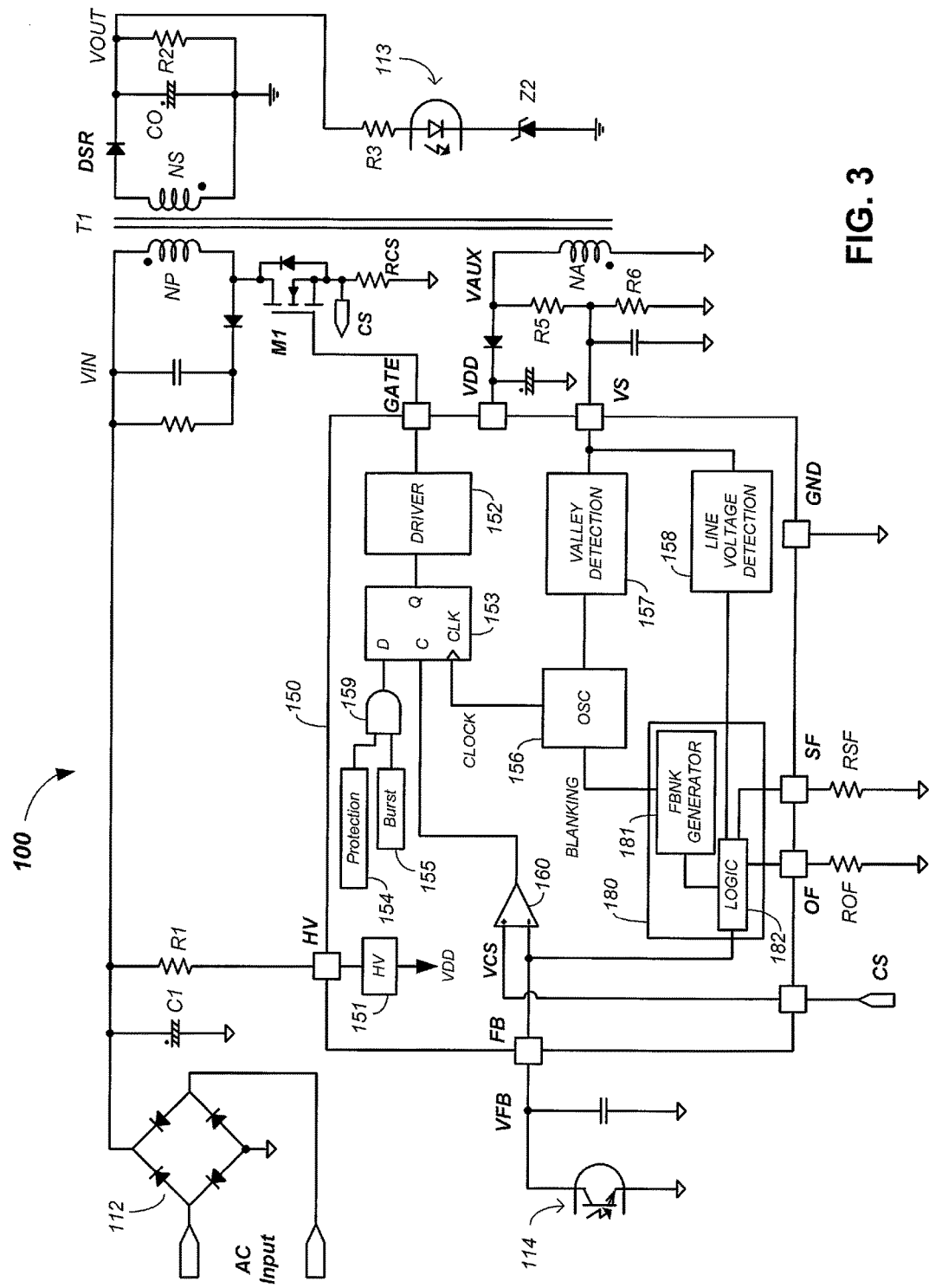
FIG. 3 shows a schematic diagram of a switched-mode power supply in accordance with an embodiment of the present invention.

FIG. 3 shows a schematic diagram of a switched-mode power supply 100 with flyback topology in accordance with an embodiment of the present invention. In the example of FIG. 3, the power supply 100 is a quasi-resonant (QR) converter with valley switching.

In the example of FIG. 3, the power supply 100 receives an AC line voltage ("line voltage") input, such as from a wall outlet. The line voltage is rectified by a rectifier circuit 112 and filtered by a capacitor C1 to develop an input voltage VIN on a node of a primary winding NP of a transformer T1. A switch element in the form of a transistor M1 (e.g., a MOSFET) serves as the primary switch on a primary side of the transformer T1. The transistor M1 connects and disconnects the primary winding NP to ground to develop an output voltage VOUT for a load (not shown) on the secondary winding NS side of the transformer T1.

In the example of FIG. 3, a QR controller integrated circuit (IC) 150 (or some discrete controller) controls the switching operation of the transistor M1, e.g., by burst mode, to develop the output voltage VOUT. In the example of FIG. 3, the controller IC 150 controls a switching operation of the transistor M1 in accordance with QR switching, with the resonant circuit being formed by, for example, the inductance of the primary winding NP and the lumped parasitic capacitance at the drain of the transistor M1. The controller IC 150 may include an HV pin for receiving the input voltage VIN by way of a resistor R1, a GATE pin connected to a gate of the transistor M1, a VDD pin for developing an internal bias voltage from an auxiliary winding NA of the transformer T1, a VS pin for receiving a sense voltage that is indicative of the output voltage VOUT, a GND pin for receiving a ground reference, an SF pin for receiving a resistor RSF for programming shifting of a blanking frequency foldback curve, an OF pin for receiving a resistor ROF for programming offsetting of the blanking frequency foldback curve, a CS pin for receiving a current sense signal that is indicative of the primary current through the primary winding NP, and an FB pin for receiving a feedback signal indicative of the load condition.

In the example of FIG. 3, the feedback signal is a feedback voltage VFB that is generated by a feedback circuit comprising a resistor R3, Zener diode Z2, and an optocoupler formed by a light emitting diode 113 and a phototransistor 114. In the example of FIG. 3, the conduction of the phototransistor 114 increases with the output voltage VOUT. The feedback voltage VFB decreases as the output voltage VOUT increases, and increases as the output voltage VOUT decreases.

The output voltage VOUT reflects the load condition. The load condition is light when the load draws a small amount of output current from the power supply 100, and the load condition is heavy when the load draws a large amount of output current from the power supply 100. The output voltage VOUT tends to decrease when the load is heavy and tends to increase when the load is light. Therefore, the controller 150 can detect load condition from the feedback voltage VFB.

In the example of FIG. 3, an auxiliary voltage VAUX on an auxiliary winding NA of the transformer T1 is received at the VDD pin to generate an internal supply voltage. The controller IC 150 additionally includes a bias generator 151 for generating an internal supply voltage from the input voltage VIN by way of the HV pin.

In the example of FIG. 3, an inductance of the primary winding NP and a parasitic capacitance on the drain of the transistor M1 forms a resonant circuit. Turning on the transistor M1 increases the primary winding NP current and magnetic flux, stores energy in the transformer T1, and the input voltage VIN voltage reflects from the primary winding NP to the secondary winding NS by the turns ratio NS/NP. The reflected voltage on the secondary winding NS places a diode rectifier DSR in reverse bias. When the transistor M1 is turned off, the primary winding NP current and magnetic flux drop, and the magnetic current in the transformer T1 forward biases the diode rectifier DSR and charges the output capacitor CO to generate a DC output voltage VOUT, which is delivered to the load (not shown). When the energy stored in the transformer T1 is dissipated, the drain-to-source voltage VDS of the transistor M1 resonant rings. The controller IC 150 turns on the transistor M1 when the resonant ring reaches, for example, a valley in accordance with valley switching. The valley of the resonant ring is also referred to as "resonant valley."

The voltage difference between the input voltage VIN and the drain-to-source voltage VDS of the transistor M1 (and hence the resonant ring) is reflected on the auxiliary winding NA by the ratio NA/NP. A voltage divider formed by the resistors R5 and R6 develop a sense voltage VS that can be sensed to detect the resonant valley from the voltage VDS of the transistor M1 and to detect the line voltage condition from the input voltage VIN. In the example of FIG. 3, the controller IC 150 includes a valley detection circuit 157 that is configured to detect the valley of the resonant ring from the sense voltage VS at the VS pin. The controller IC 150 also includes a line voltage detection circuit 158 that is configured to detect the line voltage condition from the sense voltage VS at the VS pin.

In the example of FIG. 3, the controller IC 150 includes a driver circuit 152 that is configured to drive the gate of the transistor M1 by sending a gate drive signal through the GATE pin. A PWM circuit comprising a flip-flop 153 has a data input D, a clear input C, a clock input CLK, and a Q output. A high or low on the data input D is propagated to the Q output when the flip-flop 153 is clocked. A high on the clear input C asynchronously clears the Q output to a low. In the example of FIG. 3, a high on the Q output turns on the transistor M1 and a low on the Q output turns off the transistor M1. A protection circuit 154 is configured to disable turning on the transistor M1 when a fault condition occurs. A burst circuit 155 is configured to turn on and off the transistor M1 in burst mode. When the protection circuit 154 outputs a high, indicating no fault condition, the output of the burst circuit 155 is presented to the data input D and propagated to the Q output of the flip-flop 153 when clocked by the clock output of an oscillator 156.

In one embodiment, the oscillator 156 is disabled, i.e., does not output a clock signal, during a blanking time indicated by a blanking signal output of a blanking frequency (FBNK) generator 181. The valley detection circuit 157 outputs a valley detect signal, indicating detection of the resonant valley. When the blanking signal is not asserted (as in the expiration of the blanking time), the oscillator 156 generates the clock signal in response to receiving the valley detect signal from the valley detection circuit 157.

In the example of FIG. 3, a blanking module 180 includes the blanking frequency generator 181 and glue logic 182. The line voltage detection circuit 158 is configured to detect the line voltage condition to generate a corresponding output that is provided to the glue logic 182. The glue logic 182 also receives the feedback voltage VFB that is indicative of the load condition. In one embodiment, the blanking frequency generator 181 sets the blanking time as a function of the feedback voltage, in accordance with a blanking frequency foldback curve, based on the line voltage condition.

A blanking frequency foldback curve may be represented by an equation that is embodied as a circuit of the blanking frequency generator 181. The feedback voltage VFB may be adjusted to generate an adjusted feedback voltage that is provided to the feedback voltage input of the blanking frequency generator 181 to offset the blanking frequency foldback curve along its y-axis and/or to shift the blanking frequency foldback curve along its x-axis. In one embodiment, the y-axis of the blanking frequency foldback curve represents blanking frequency and the x-axis of the blanking frequency foldback curve represents the feedback voltage. As will be more apparent below, the blanking frequency foldback curve may be offset along its y-axis based on line voltage condition and shifted along its x-axis to compensate for inductance of a winding of the transformer T1 and specifications of the converter.

The controller IC 150 is configured to turn off the transistor M1 based on a level of the feedback voltage VFB. In the example of FIG. 3, the drain-to-source current IDS of the transistor M1 develops a current sense voltage VCS on the resistor RCS, which is provided to the CS pin of the controller IC 150. A comparator 160 compares the current sense voltage VCS to the feedback voltage VFB, and turns off the transistor M1 by asserting the clear input C of the flip-flop 153 when the current sense voltage VCS exceeds the feedback voltage VFB.

Figure 4:
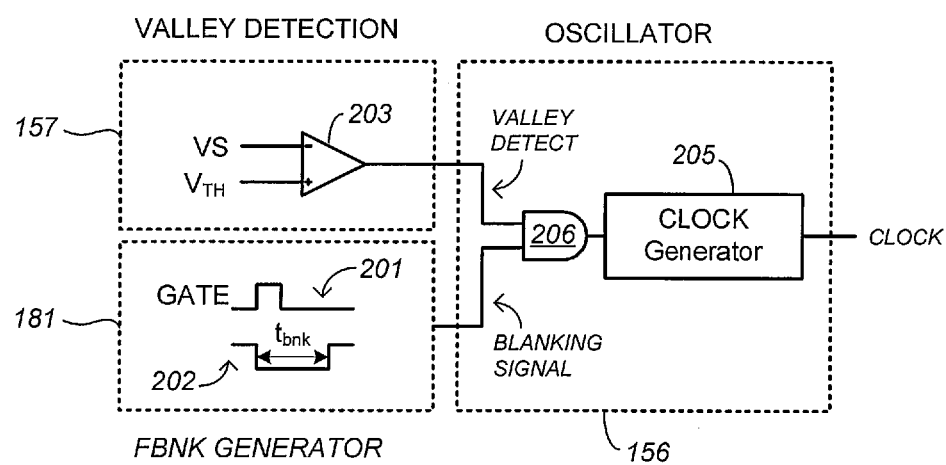
FIG. 4 shows a schematic diagram of a valley detection circuit, blanking frequency generator, and oscillator in accordance with an embodiment of the present invention.

FIG. 4 shows a schematic diagram of the valley detection circuit 157, blanking frequency generator 181, and oscillator 156 in accordance with an embodiment of the present invention. In the example of FIG. 4, the valley detection circuit 157 compares the sense voltage VS received at the VS pin of the controller IC 150 to a threshold voltage VTH to detect the resonant valley. An output of a comparator 203 is asserted when the sense voltage VS drops below the threshold voltage VTH, indicating detection of the resonant valley. The valley detect output of the valley detection circuit 157 may thus be a series of pulses that are in response to detections of resonant valleys.

The blanking frequency generator 181 is configured to prevent turning on of the transistor M1 during the blanking time. In the example of FIG. 4, this is represented by a blanking signal 202 blanking the gate drive signal 201 provided to the gate of the transistor M1. In the example of FIG. 4, the blanking frequency generator 181 generates the blanking signal to be at a logic low during the blanking time TBNK (i.e., the inverse of the blanking frequency) starting at the rising edge of the gate drive signal and then generates the blanking signal to be at a logic high after the blanking time TBNK.

In the example of FIG. 4, the oscillator 156 comprises an and-gate 206 and a clock generator 205. The and-gate 206 enables the clock generator 205 to generate the clock signal when the valley detection circuit 157 indicates detection of the resonant valley and the blanking frequency generator 181 indicates expiration of the blanking time. In effect, the gate drive signal to the transistor M1 is disabled by the blanking signal during the blanking time TBNK by screening out the resonant valley detection pulses of the valley detection circuit 157 that occur during the blanking time. More particularly, the oscillator 156 is prevented from clocking the flip-flop 153 during the blanking time to prevent the transistor M1 from being turned on at the resonant valleys of the resonant ring.

Figure 5:
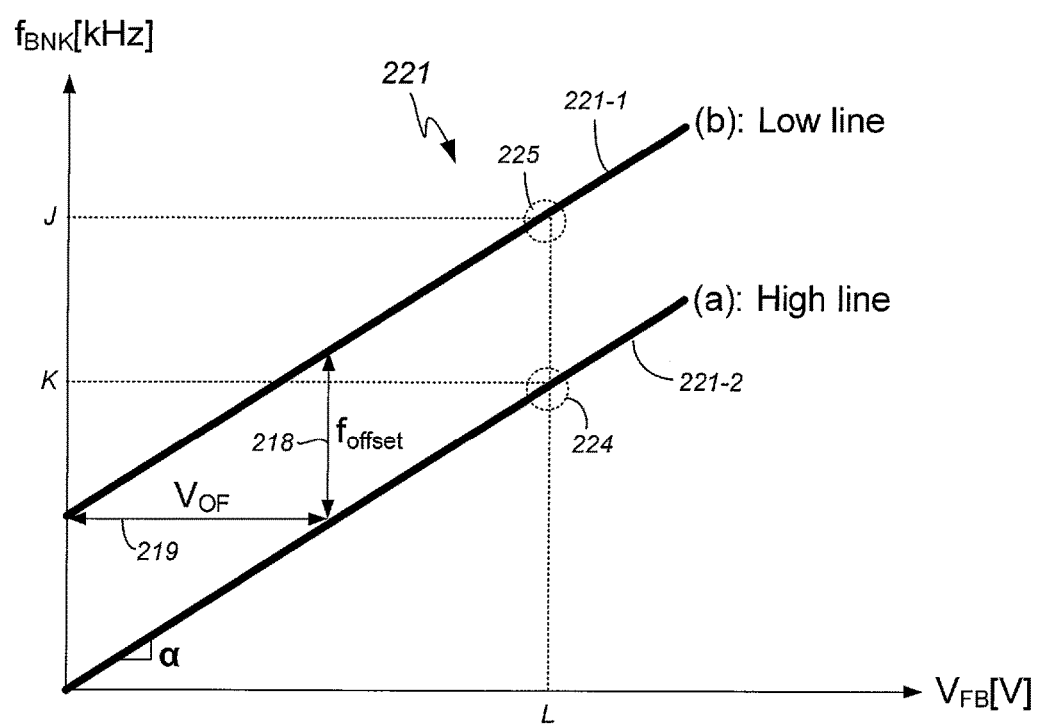
FIG. 5 shows a blanking frequency foldback curve in accordance with an embodiment of the present invention.

FIG. 5 shows a blanking frequency foldback curve 221 in accordance with an embodiment of the present invention. The blanking frequency generator 181 may be configured to generate a blanking signal with a blanking frequency in accordance with the blanking frequency foldback curve 221. More specifically, the blanking frequency generator 181 may set the blanking time as a function of the feedback voltage VFB in accordance with the blanking frequency foldback curve 221. In one embodiment, the blanking frequency foldback curve 221 is adjusted based on line voltage conditions. In the example of FIG. 5, the blanking frequency foldback curve 221 is the blanking frequency foldback curve 221-1 during low line voltage conditions, and is the blanking frequency foldback curve 221-2 during high line voltage conditions. For example, during low line voltage conditions, the blanking frequency generator 181 will set the blanking frequency at J kilohertz when the feedback voltage VFB is L volts (see point 225) in accordance with the blanking frequency foldback curve 221-1. However, during high line voltage conditions, for the same feedback voltage VFB of L volts, the blanking frequency generator 181 will set the blanking frequency at K kilohertz in accordance with the blanking frequency foldback curve 221-2 (see point 224).

Generally speaking, the blanking frequency dictates when the transistor M1 is turned on, and is thus directly related to the switching frequency of the transistor M1. To achieve high-efficiency, switching losses should be minimized at high line voltage conditions and light load conditions, and conduction losses should be minimized at low line voltage conditions and heavy load conditions. As can be seen from FIG. 5, for a given feedback voltage VFB, the blanking frequency is higher during low line voltage by following the foldback curve 221-1 to minimize conduction loss. For a given feedback voltage VFB, the blanking frequency is lower during high line voltage by following the foldback curve 221-2 to minimize switching loss.

In the example of FIG. 5, the blanking frequency foldback curve 221 is offset up and down along the y-axis to follow either the blanking frequency feedback curve 221-1 or blanking frequency feedback curve 221-2 depending on the line voltage (see FOFFSET). The blanking frequency foldback curve 221 may be offset along the y-axis (see 218) by adding a programming voltage in the form of an offset voltage VOF (see 219) to the feedback voltage VFB. Put another way, the blanking frequency foldback curves 221-1 and 221-2 are the same foldback curve that is offset along the y-axis by adding the offset voltage VOF to the feedback voltage VFB depending on the line voltage.

Figure 6:
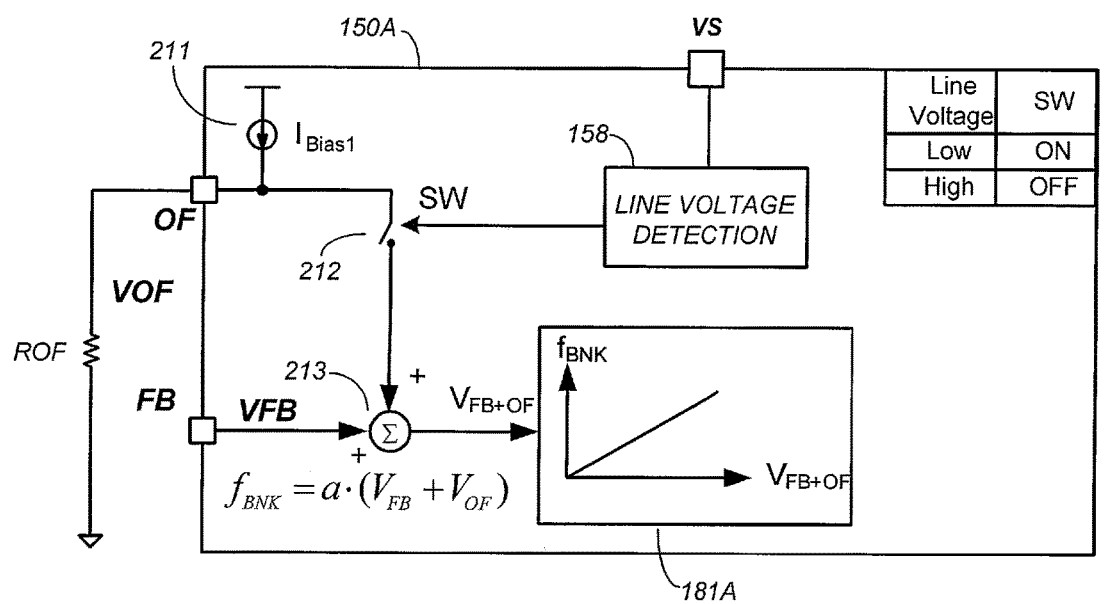
FIG. 6 shows a schematic diagram of a controller integrated circuit (IC) in accordance with an embodiment of the present invention.

FIG. 6 shows a schematic diagram of a controller IC 150A in accordance with an embodiment of the present invention. The controller IC 150A is a particular implementation of the controller IC 150.

In the example of FIG. 6, the controller IC 150A includes a current source 211, a switch 212, and a summer 213. In the example of FIG. 6, the blanking frequency generator 181A is a blanking frequency generator 181 that is programmed to implement the blanking frequency foldback curve 221 of FIG. 5. More particularly, the blanking frequency generator 181A sets the blanking frequency of the blanking signal as a function of the feedback voltage VFB as dictated by the blanking frequency foldback curve 221. The blanking frequency foldback curve 221 may be offset along the y-axis by adding an offset voltage VOF to the feedback voltage VFB. The level of the offset voltage VOF may be set based on the level of the line voltage as detected by the line voltage detection circuit 158.

In the example of FIG. 6, the line voltage detection circuit 158 generates a switch SW signal that closes the switch 212 when the line voltage is low, and that opens the switch 212 when the line voltage is high. The current source 211 generates a bias current IBIAS1 that develops the offset voltage VOF at the resistor ROF on the OF pin. The designer may thus set the level of the offset voltage VOF by selecting the resistance of the resistor ROF.

The range of line voltage levels considered low and the range of line voltage levels considered high will depend on the particulars of the application, and may be set in the line voltage detection circuit 158 using a comparator to compare the line voltage to a reference voltage, for example. In the example of FIG. 6, the switch 212 is closed when the line voltage is low, thereby providing the offset voltage VOF to the summer 213. The summer 213 adds the offset voltage VOF to the feedback voltage VFB to generate an adjusted feedback voltage (VFB+OF), which is provided to the blanking frequency generator 181A. Given a constant α (e.g., slope of the blanking frequency foldback curve 221), the blanking frequency foldback curve 221 may thus represented by equation 1, $$FBNK = \alpha(VFB + VOF) \quad (EQ\ 1).$$

The higher the adjusted feedback voltage (i.e., VFB+VOF), the higher the blanking frequency to minimize conduction loss when the line voltage is low. That is, when the line voltage is low, the blanking frequency generator 181A sets the blanking frequency as in the blanking frequency foldback curve 221-1 (see FIG. 5).

On the other hand, the switch 212 is open when the line voltage is high, thereby cutting off the offset voltage VOF from the summer 213. In that case, when the line voltage is high, the blanking frequency generator 181A sets the blanking frequency in accordance with the blanking frequency foldback curve 221-2, which is also given by equation 1 with the offset voltage VOF equal to zero.

Figure 7:
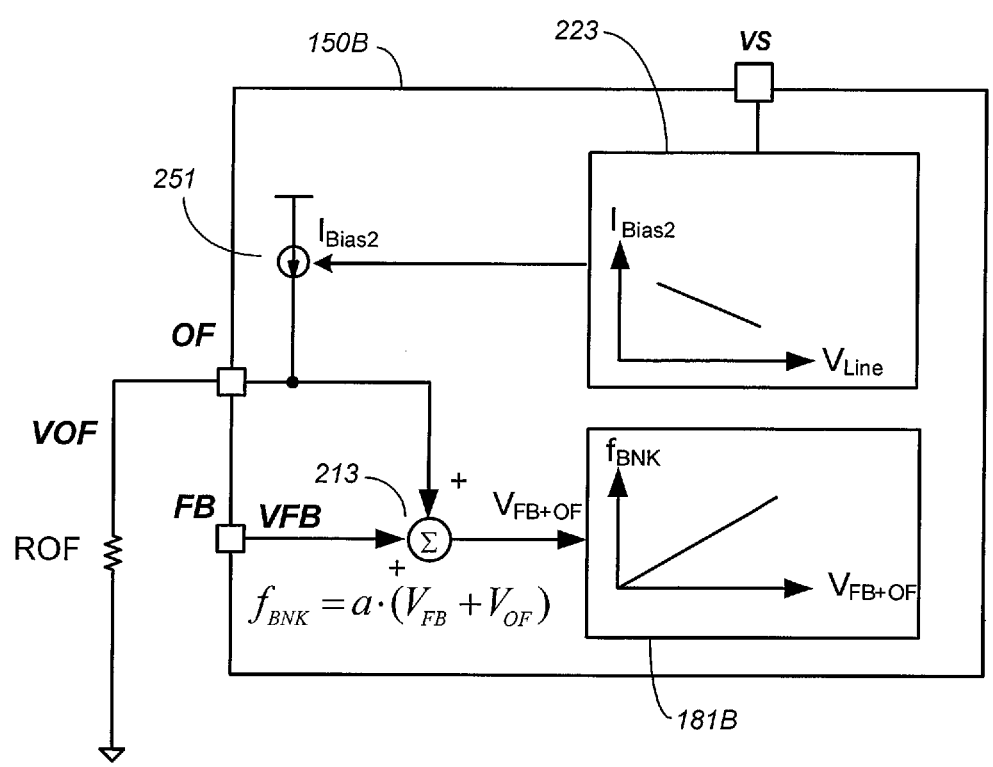
FIG. 7 shows a controller IC in accordance with another embodiment of the present invention.

FIG. 7 shows a schematic diagram of a controller IC 150B in accordance with an embodiment of the present invention. The controller IC 150B is a particular implementation of the controller IC 150.

In the example of FIG. 7, the controller IC 150B replaces the current source/switch arrangement of the controller IC 150A with a variable current source 251 and a bias current adjustment circuit 223. The controller ICs 150B and 150A are otherwise the same.

In the example of FIG. 7, the bias current adjustment circuit 223 controls the variable current source 251 to adjust its bias current IBIAS2 output. More particularly, the bias current adjustment circuit 223 detects the line voltage from the sense voltage on the VS pin. The bias current adjustment circuit 223 controls the variable current source 251 to increase the bias current IBIAS2 as the line voltage decreases, and to decrease the bias current IBIAS2 as the line voltage increases. The bias current IBIAS2 develops the offset voltage VOF on the resistor ROF. Accordingly, the offset voltage VOF increases as the line voltage decreases, and decreases as the line voltage increases. The offset voltage VOF is added to the feedback voltage VFB to generate the adjusted feedback voltage (VFB+OF) that is provided to the blanking frequency generator 181B. The blanking frequency generator 181B generates the blanking frequency in accordance with equation 1. As before, the higher the adjusted feedback voltage, the higher the blanking frequency.

In the example of FIG. 7, the blanking frequency generator 181B is the same as the blanking frequency generator 181A except that the offset voltage VOF in the controller IC 150B has a plurality of levels. That is, whereas the offset voltage VOF in the controller IC 150A has two levels, the offset voltage VOF in the controller IC 150B has a plurality of levels because of the adjustable bias current IBIAS2. This is reflected in the blanking frequency foldback curve of the blanking frequency generator 181B of the controller IC 150B.

Figure 8:
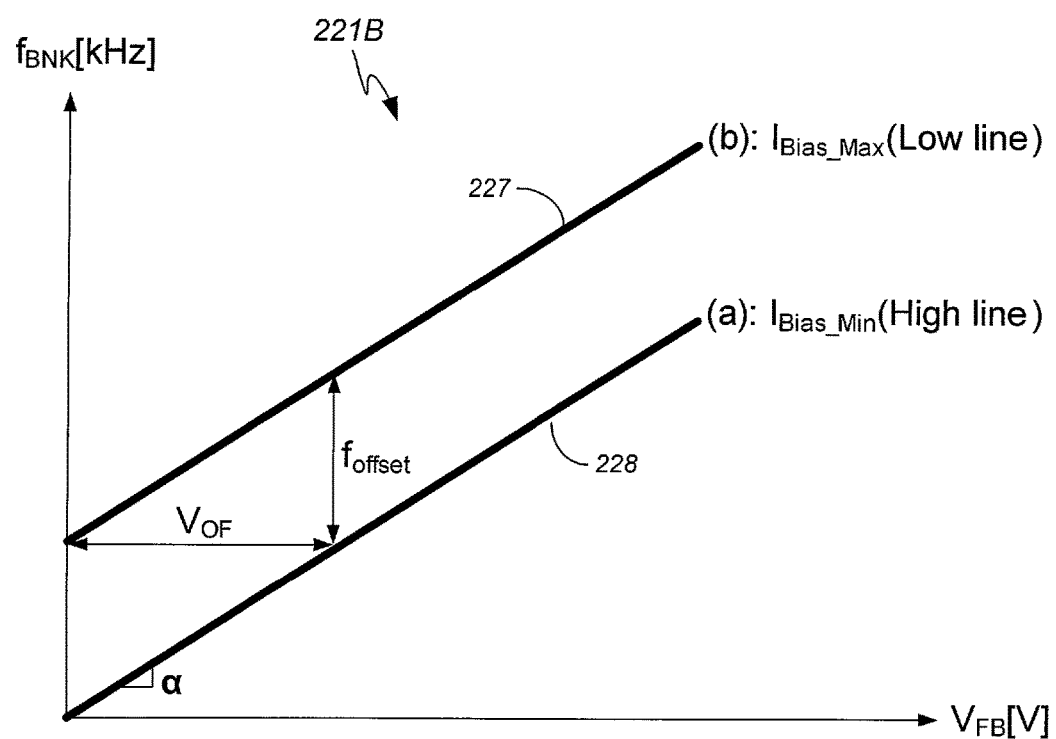
FIG. 8 shows a blanking frequency foldback curve in accordance with an embodiment of the present invention.

FIG. 8 shows a blanking frequency foldback curve 221B implemented by the blanking frequency generator 181B in accordance with an embodiment of the present invention. The blanking frequency foldback curve 221B is a particular implementation of the blanking frequency foldback curve 221, except that the blanking frequency foldback curve 221B may be continuously adjusted between the blanking frequency foldback curves 227 and 228. This is because the offset voltage VOF may be continuously adjusted in the controller IC 150B. The blanking frequency foldback curves 221 and 221B may thus be represented by the same function, e.g., equation 1, with the offset voltage VOF being continuously adjustable. The blanking frequency foldback curve 227 represents the blanking frequency foldback curve 221B when the bias current IBIAS2 is at its maximum, and the blanking frequency foldback curve 228 represents the blanking frequency foldback curve 221B when the bias current IBIAS2 is at its minimum. The blanking frequency foldback curves 221 and 221B are otherwise the same.

The blanking frequency is directly related to the switching frequency of the converter, which in turn is affected by the inductance of the windings of the transformer and the specifications of the converter. The inductance of the windings is dictated by the size of the transformer's core. As a practical matter, it is difficult to find the optimal switching frequency with various values of inductance and different converter specifications. In one embodiment, to achieve high efficiency with different values of inductance and converter specifications, the blanking frequency foldback curve is adjustable to be shifted left and right along the x-axis, i.e., along the axis of the feedback voltage VFB.

Figure 9:
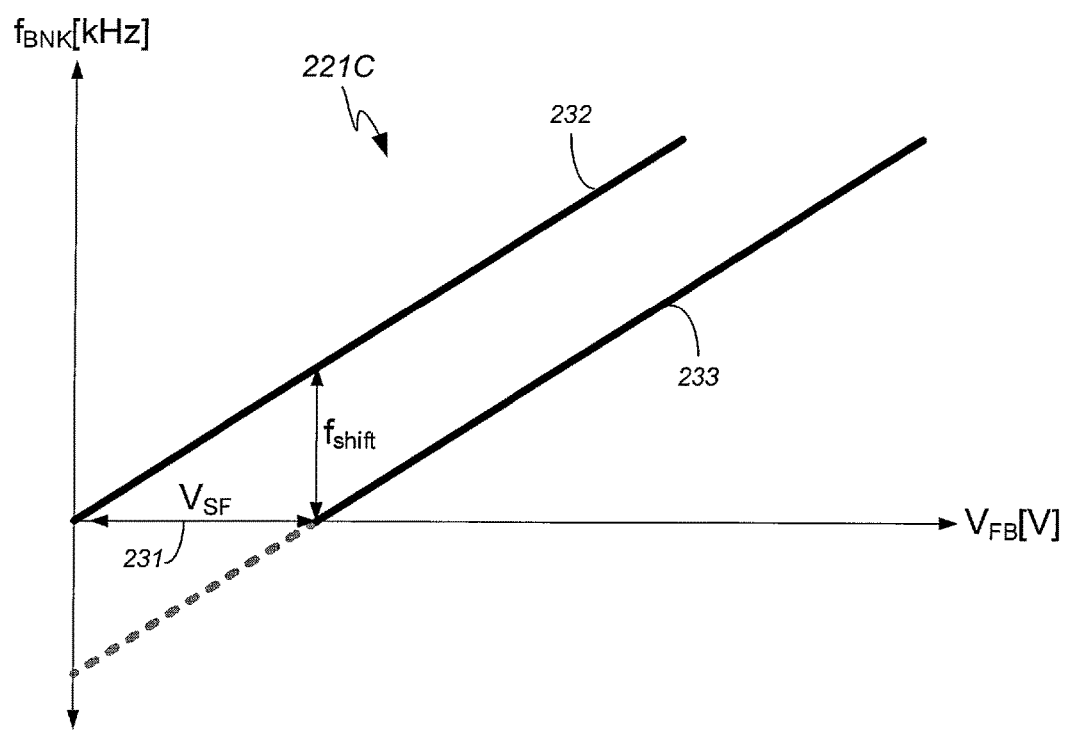
FIG. 9 shows a blanking frequency foldback curve in accordance with another embodiment of the present invention.

FIG. 9 shows a blanking frequency foldback curve 221C in accordance with an embodiment of the present invention. The blanking frequency foldback curve 221C may be adjusted along the axis of the feedback voltage VFB by adding a programming voltage in the form of a shift frequency voltage VSF (see 231) to the feedback voltage VFB. This has the effect of moving the blanking frequency foldback curve 221C along the axis of the feedback voltage VFB, e.g., to behave as the blanking frequency foldback curve 232, the blanking frequency foldback curve 233, etc. That is, the blanking frequency foldback curves 232 and 233 are the same blanking frequency foldback curve 221C shifted along the axis of the feedback voltage VFB.

Figure 10:
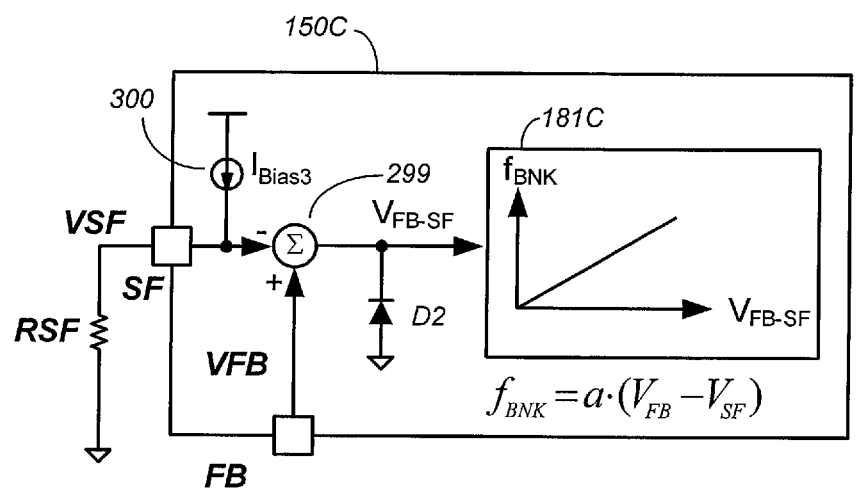
FIG. 10 shows a schematic diagram of a controller IC in accordance with another embodiment of the present invention.

FIG. 10 shows a schematic diagram of the controller IC 150C in accordance with an embodiment of the present invention. The controller IC 150C is a particular implementation of the controller IC 150.

In the example of FIG. 10, the controller IC 150C has a blanking frequency generator 181C, which implements the blanking frequency foldback curve 221C. In the example of FIG. 10, a current source 300 generates a bias current IBIAS3 that develops a shift frequency voltage VSF on the resistor RSF that is connected to the SF pin. The resistance of the resistor RSF may be selected to set the amount by which the blanking frequency foldback curve 221C is frequency shifted to compensate for different winding inductances and converter specifications. A summer 299 subtracts the shift frequency voltage VSF from the feedback voltage VFB that is received on the FB pin, and provides the difference to the blanking frequency generator 181C as an adjusted feedback voltage (VFB−SF). A diode D2 is across the output of the summer 299 to limit a minimum voltage of an adjusted feedback voltage (VFB−SF) to zero. Given a constant α (e.g., slope of the blanking frequency foldback curve 221C), the blanking frequency foldback curve 221C may thus represented by equation 2, $$FBNK=\alpha(VFB-VSF) \quad \quad (EQ\ 2).$$

The switching frequency of the transistor M1 affects the audible noise emission of the converter. Generally speaking, the lower the switching frequency, the more audible noise. In one embodiment, the switching frequency is prevented from entering the audible noise range by limiting the lowest blanking frequency to a minimum blanking frequency. On the higher end of the switching frequency range, electromagnetic interference (EMI), efficiency, and temperature of components are affected by switching frequency. In one embodiment, these issues are addressed by limiting the highest blanking frequency to a maximum blanking frequency.

Figure 11:
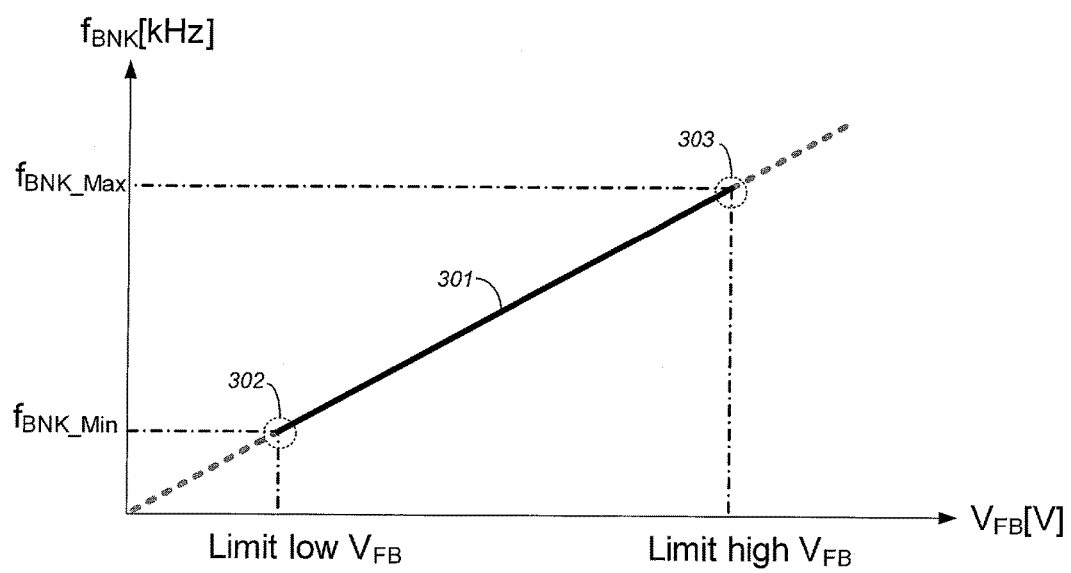
FIG. 11 shows a blanking frequency foldback curve in accordance with another embodiment of the present invention.

FIG. 11 shows a blanking frequency foldback curve 301 in accordance with an embodiment of the present invention. The blanking frequency foldback curve 301 may be implemented by a blanking frequency generator. In the example of FIG. 11, the blanking frequency foldback curve 301 has a maximum blanking frequency (FBNK_MAX) at a high limit feedback voltage VFB (see point 303) and a minimum blanking frequency (FBNK_MIN) at a low limit feedback voltage VFB (see point 302). More particularly, the minimum and maximum of the feedback voltage VFB limit the blanking frequency between a minimum value and a maximum value, respectively. Limiting the blanking frequency between a minimum value and a maximum value addresses the aforementioned issues relating to audible noise, EMI, etc.

Figure 12:
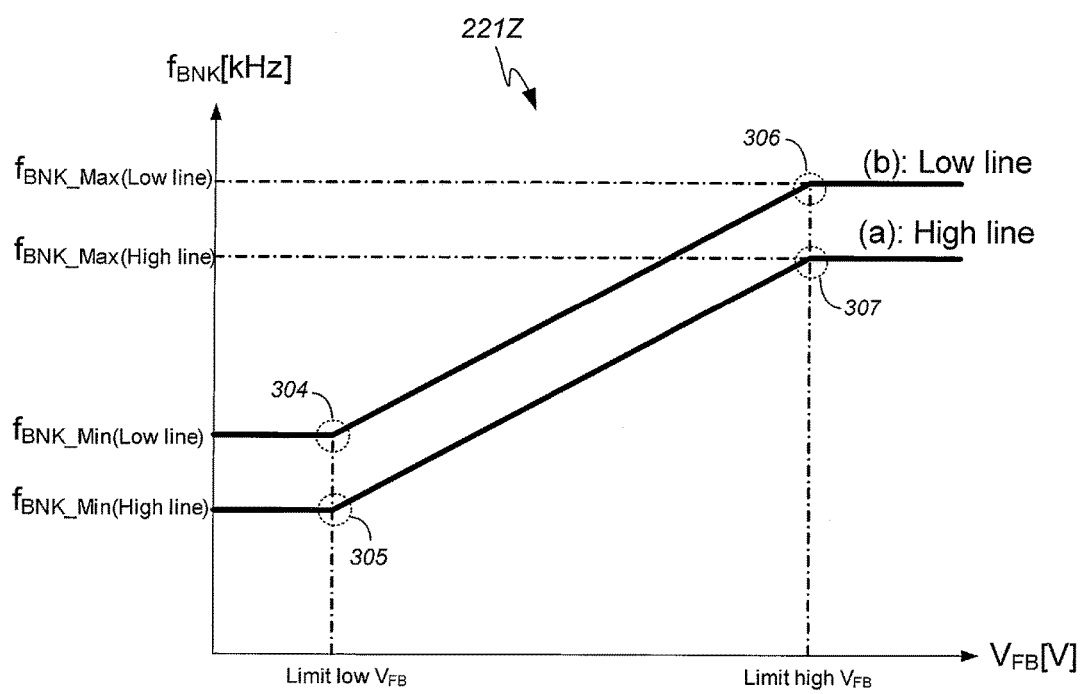
FIG. 12 shows a blanking frequency foldback curve in accordance with another embodiment of the present invention.

Features relating to limiting the lowest and highest blanking frequencies may be applied to previously described blanking frequency foldback curves. For example, FIG. 12 shows a blanking frequency foldback curve 221Z, which is the same as the blanking frequency foldback curve 221 (see FIG. 5) except for having a minimum and a maximum feedback voltage VFB to limit the range of the blanking frequency at low line voltage and high line voltage conditions. In the example of FIG. 12, the feedback voltage VFB has a minimum low limit value. Accordingly, the blanking frequency cannot go below the minimum blanking frequency at low line voltage conditions (see point 304) and at high line voltage conditions (see point 305). Similarly, the blanking frequency cannot go higher than the maximum blanking frequency at low line voltage conditions (see point 306) and at high line voltage conditions (see point 307).

Figure 13:
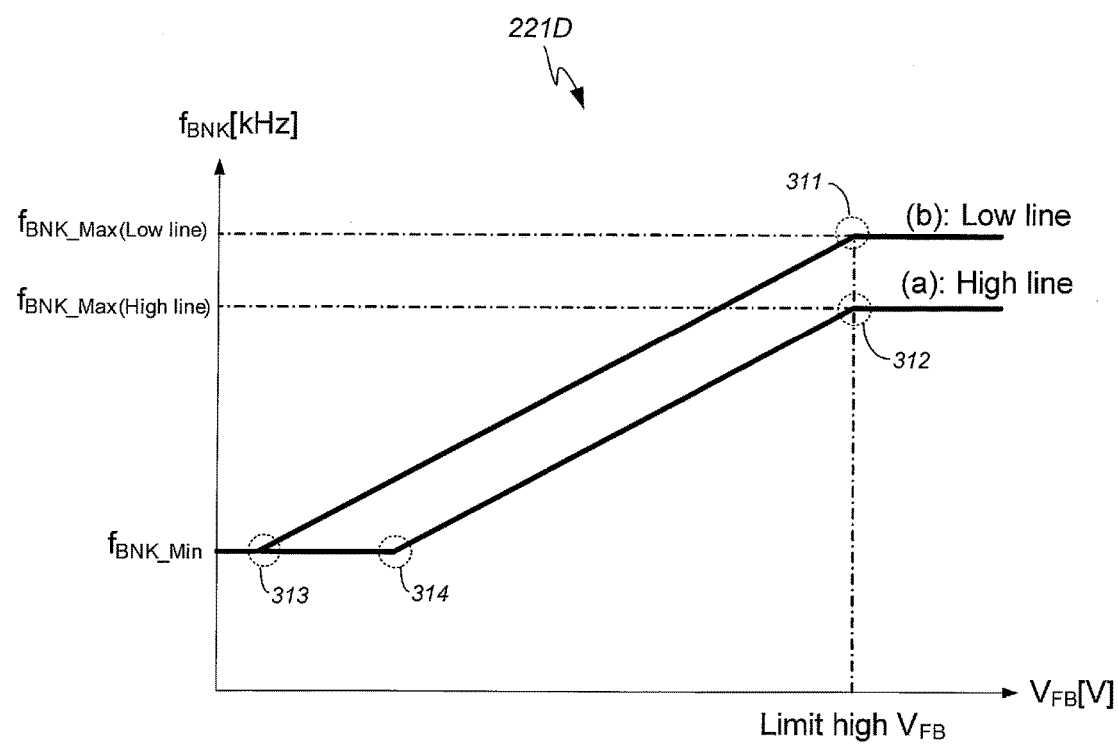
FIG. 13 shows a blanking frequency foldback curve in accordance with another embodiment of the present invention.

FIG. 13 shows a blanking frequency foldback curve 221D, which is the same as the blanking frequency foldback curve 221Z (see FIG. 12) except that the minimum blanking frequency is the same regardless of the line voltage condition and feedback voltage VFB. The fixed minimum blanking frequency may be internally set at the blanking frequency generator during manufacture. More particularly, in the example of FIG. 13, the blanking frequency cannot go below the blanking frequency FBNK_MIN regardless of the feedback voltage VFB and the line voltage condition (see points 313 and 314). On the other hand, the maximum blanking frequency is different at low line voltage conditions (see point 311) and high line voltage conditions (see point 312) and occur when the feedback voltage VFB is at the high limit.

Figure 14:
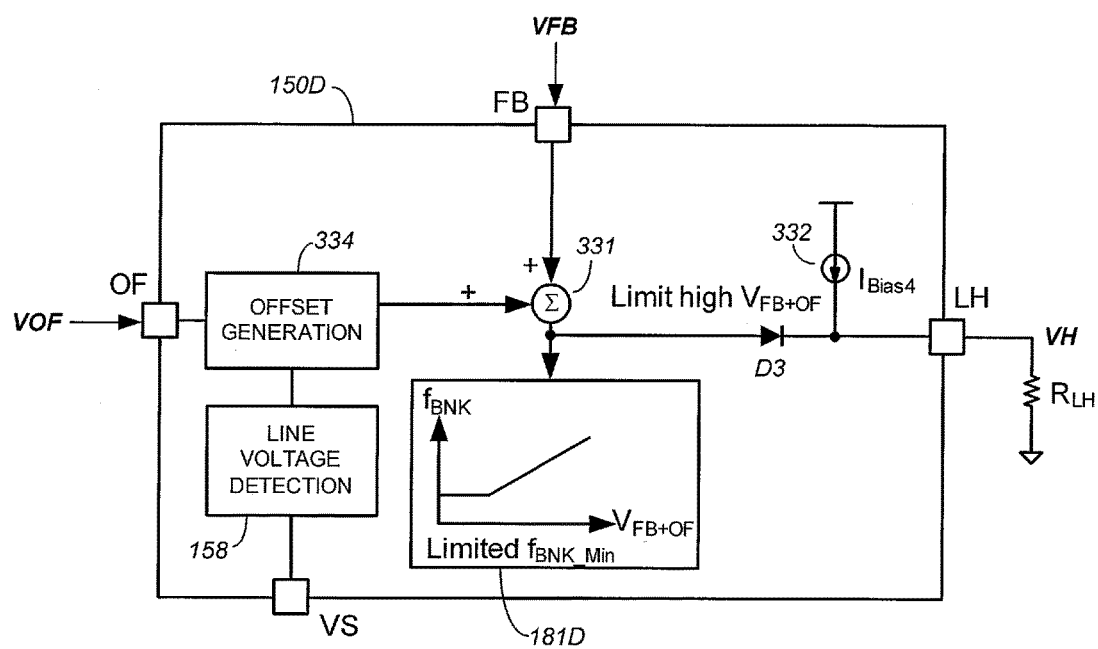
FIG. 14 shows a schematic diagram of a controller IC in accordance with another embodiment of the present invention.

FIG. 14 shows a schematic diagram of the controller IC 150D in accordance with an embodiment of the present invention. The controller IC 150D is a particular implementation of the controller IC 150. In the example of FIG. 14, the blanking frequency generator 181D implements the blanking frequency foldback curve 221D of FIG. 13.

The controller IC 150D includes the line voltage detection circuit 158 to detect the sense voltage, which is indicative of the line voltage, at the VS pin. The offset generation circuit 334 receives the offset voltage VOF at the OF pin. The offset generation circuit 334 adjusts the offset voltage VOF provided to a summer 331 based on the line voltage as indicated by the line voltage detection circuit 158. The offset generation circuit 334 may be implemented as in the controller IC 150A (FIG. 6; current source 211 and switch 212) or the controller IC 150B (FIG. 7; variable current source 251 and bias current adjustment circuit 223). The summer 331 adds the offset voltage output of the offset generation circuit 334 to the feedback voltage VFB to generate an adjusted feedback voltage (VFB+OF), which is provided to the feedback voltage input of the blanking frequency generator 181D. The blanking frequency generator 181D sets the blanking frequency based on the adjusted feedback voltage (VFB+OF) as indicated by the blanking frequency foldback curve 221D.

In the example of FIG. 14, the controller IC 150D further includes an LH pin for setting the maximum feedback voltage input to the blanking frequency generator 181D. More particularly, a current source 332 develops a high limit voltage VH on a resistor RLH that is connected to the LH pin. The resistance of the resistor RLH may be selected by the designer to program the maximum blanking frequency. The high limit voltage VH is connected to a cathode of a diode D3, and an anode of the diode D3 is connected to the feedback voltage input of the blanking frequency generator 181D. Accordingly, when the feedback voltage input of the blanking frequency exceeds the high limit voltage VH, the diode D3 conducts and clamps the feedback voltage input to the high limit voltage VH, thereby limiting the highest blanking frequency.

Figure 15:
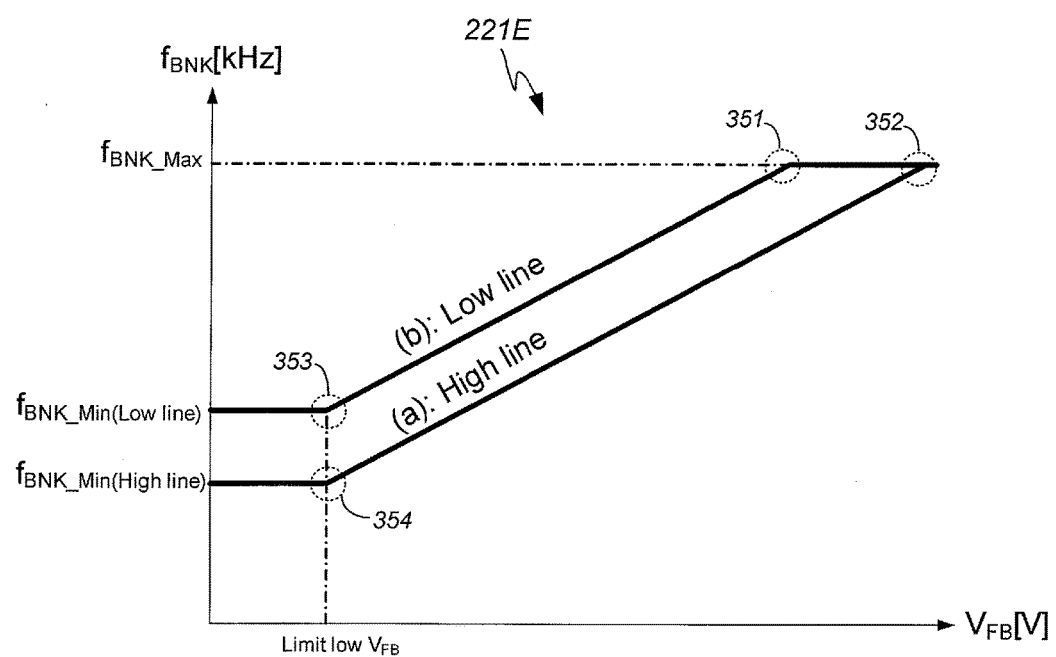
FIG. 15 shows a blanking frequency foldback curve in accordance with another embodiment of the present invention.

FIG. 15 shows a blanking frequency foldback curve 221E, which is the same as the blanking frequency foldback curve 221Z (see FIG. 12) except that the maximum blanking frequency is the same regardless of the line voltage condition and feedback voltage VFB. The fixed maximum blanking frequency may be internally set at the blanking frequency generator during manufacture. More particularly, in the example of FIG. 15, the blanking frequency cannot go higher than the blanking frequency FBNK_MAX regardless of the feedback voltage VFB and the line voltage condition (see points 351 and 352). On the other hand, the minimum blanking frequency is different at low line voltage conditions (see point 353) and high line voltage conditions (see point 354) and occur when the feedback voltage VFB is at the low limit.

Figure 16:
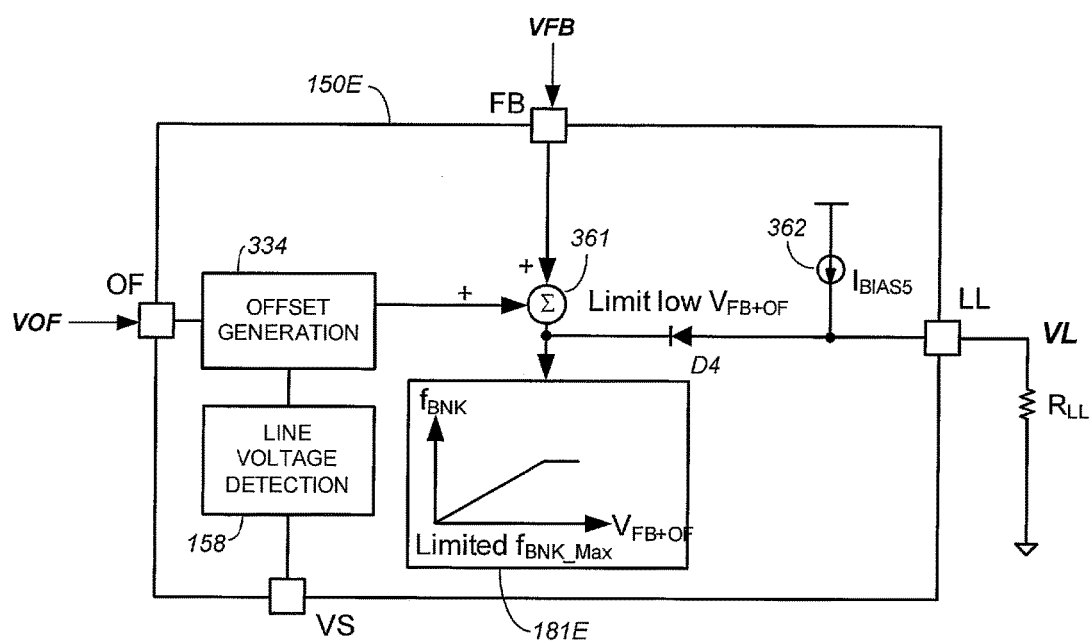
FIG. 16 shows a schematic diagram of a controller IC in accordance with another embodiment of the present invention.

FIG. 16 shows a schematic diagram of a controller IC 150E in accordance with an embodiment of the present invention. The controller IC 150E is a particular implementation of the controller IC 150. In the example of FIG. 16, the controller IC 150E has a blanking frequency generator 181E that implements the blanking frequency foldback curve 221E of FIG. 15.

The controller IC 150E includes the line voltage detection circuit 158 to detect the sense voltage, which is indicative of the line voltage, at the VS pin. The offset generation circuit 334 receives the offset voltage VOF at the OF pin. The offset generation circuit 334 adjusts the offset voltage VOF based on the line voltage as indicated by the line voltage detection circuit 158. The offset generation circuit 334 may be implemented as in the controller IC 150A (FIG. 6; current source 211 and switch 212) or the controller IC 150B (FIG. 7; variable current source 251 and bias current adjustment circuit 223). The summer 361 adds the offset voltage output of the offset generation circuit 334 to the feedback voltage VFB to generate an adjusted feedback voltage (VFB+OF), and provides the sum to the feedback voltage input of the blanking frequency generator 181E. The blanking frequency generator 181E sets the blanking frequency based on the adjusted feedback voltage (VFB+OF) as per the blanking frequency foldback curve 221E.

In the example of FIG. 16, the controller IC 150E further includes an LL pin for setting the minimum feedback voltage input to the blanking frequency generator 181E. More particularly, a current source 362 develops a low limit voltage VL on a resistor RLL that is connected to the LL pin. The resistance of the resistor RLL may be selected by the designer to program the minimum blanking frequency. The low limit voltage VL is connected to an anode of a diode D4, and a cathode of the diode D4 is connected to the feedback voltage input of the blanking frequency generator 181E. Accordingly, when the feedback voltage input of the blanking frequency decreases below the low limit voltage VL, the diode D4 conducts and clamps the feedback voltage input to the low limit voltage VL, thereby limiting the lowest blanking frequency.

Figure 17:
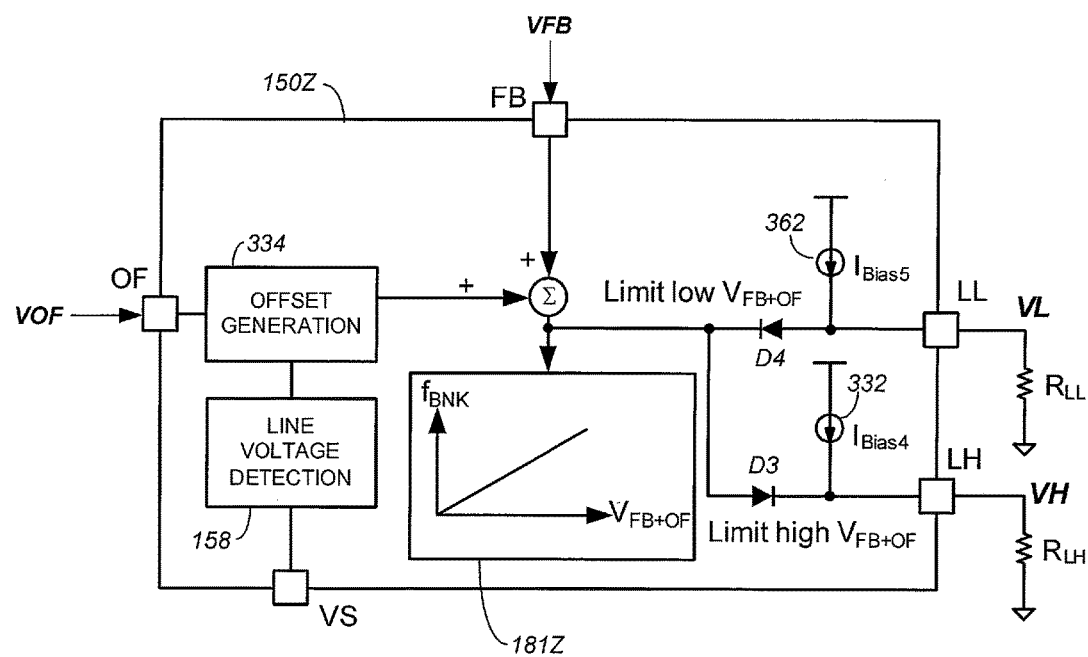
FIG. 17 shows a schematic diagram of a controller IC in accordance with another embodiment of the present invention.

The programmable minimum blanking frequency of the controller IC 150E (FIG. 16) and programmable maximum blanking frequency of the controller IC 150D (FIG. 14) may be combined so that the designer can program both the minimum and maximum blanking frequencies as in the blanking frequency foldback curve 221Z (FIG. 12). This embodiment is illustrated in FIG. 17, wherein the controller IC 150Z includes the LL pin and the LH pin. In the example of FIG. 17, the blanking frequency generator 181Z implements the blanking frequency foldback curve 221Z of FIG. 12. The minimum and maximum blanking frequencies may be programmed by the designer by selecting the resistance of the resistors RH and RL as previously described.

Figure 18:
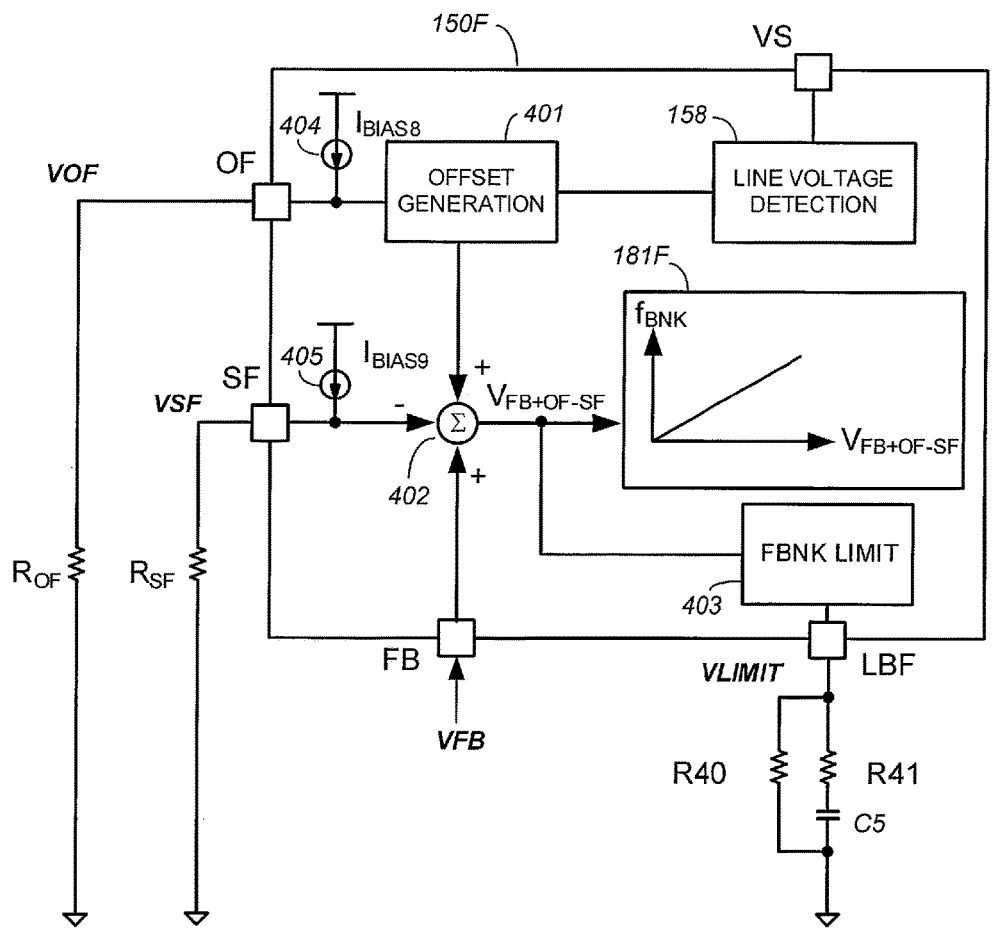
FIG. 18 shows a schematic diagram of a controller IC in accordance with another embodiment of the present invention.

As can be appreciated from the foregoing, embodiments of the present invention may be combined in the same controller IC 150 as shown in FIG. 18.

FIG. 18 shows a schematic diagram of a controller IC 150F in accordance with an embodiment of the present invention. The controller IC 150F is a particular implementation of the controller IC 150 with provisions for offsetting the blanking frequency foldback curve along the y-axis to compensate for line voltage variations, shifting the blanking frequency foldback curve along the x-axis to compensate for transformer winding inductance and converter specifications, and limiting the range (e.g., maximum and/or minimum) of the blanking frequency foldback curve as previously described.

In the example of FIG. 18, a current source 404 generates a bias current IBIAS8 that develops the offset voltage VOF on the resistor ROF. The designer may choose the resistance of the resistor ROF to program the amount the blanking frequency foldback curve will be offset based on line voltage conditions as detected by the line voltage detection circuit 158. The offset generation circuit 401 is configured to adjust the offset voltage VOF based on line voltage conditions to generate an adjusted offset voltage that is provided to the summer 402.

In the example of FIG. 18, a current source 405 generates a bias current IBIAS9 that develops the shift frequency voltage VSF on the resistor RSF. The designer may choose the resistance of the resistor RSF to program the amount the blanking frequency foldback curve is shifted along the x-axis to compensate for transformer winding inductance and converter specifications. The summer 402 subtracts the shift frequency voltage VSF from the feedback voltage VFB and adds the adjusted offset voltage VOF from the feedback voltage VFB before providing the feedback voltage VFB to the feedback voltage input of the blanking frequency generator 181F. The blanking frequency generator 181F sets the blanking frequency based on the adjusted feedback voltage (VFB+OF−SF) in accordance with its blanking frequency foldback curve. The offsetting of the blanking frequency foldback curve along the y-axis and shifting of the blanking frequency foldback curve along the x-axis are as previously described.

In the example of FIG. 18, a controller IC 150F includes a blanking frequency limit LBF pin for receiving external components for programming the maximum and/or minimum blanking frequency. A resistor R41 is in series with a capacitor C5, and a resistor R40 is across the series circuit formed by the resistor R41 and capacitor C5. Because of the capacitor C5, the level of the voltage VLIMIT on the LBF pin is different at startup and at steady-state. A blanking frequency limit circuit 403 is configured to sample the voltage VLIMIT on the LBF pin at startup and at steady-state to determine the maximum and/or minimum blanking frequency desired by the designer, and set the maximum and/or minimum blanking frequency accordingly. More particularly, the designer can program the maximum and/or minimum blanking frequency by selecting the values of the external components connected to the LBF pin. This advantageously decreases the pin count of the controller IC 150F.

Figure 19:
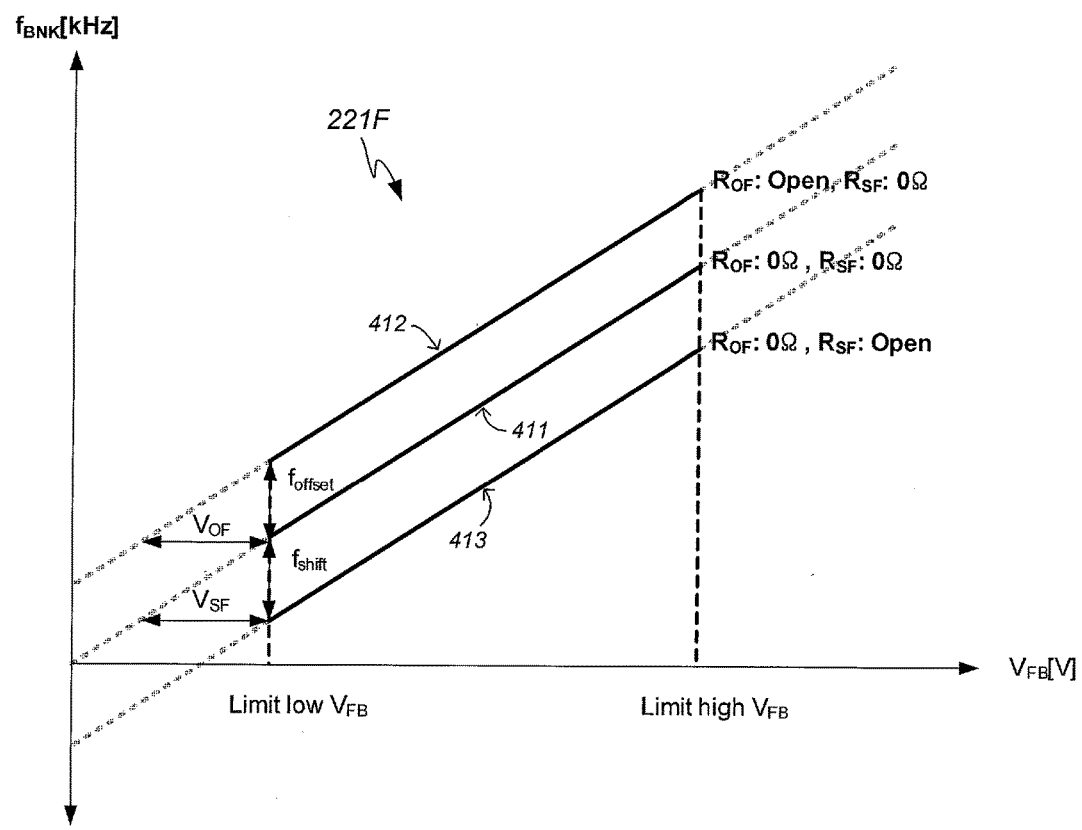
FIG. 19 shows a blanking frequency foldback curve in accordance with another embodiment of the present invention.

FIG. 19 shows a blanking frequency foldback curve 221F in accordance with an embodiment of the present invention. The blanking frequency foldback curve 221F may be implemented by the blanking frequency generator 181F. As in previously described embodiments, the blanking frequency foldback curve 221F may be offset along the y-axis based on the value of the offset voltage VOF (which may be modified based on the line voltage), and shifted along the x-axis based on the value of the shift frequency voltage VSF. FIG. 19 shows the blanking frequency foldback curve 221F with different values of resistors ROF and RSF to illustrate blanking frequency offsetting and shifting. More particularly, FIG. 19 shows the blanking frequency foldback curve 221F when the resistor ROF is open and the resistor RSF is 0Ω (see 412), when the resistor ROF is 0Ω and the resistor RSF is 0Ω (see 411), and when the resistor ROF is 0Ω and the resistor RSF is open (see 413). The blanking frequency foldback curve 221F may have a minimum blanking frequency at a low limit feedback voltage VFB and a maximum blanking frequency at the high limit feedback voltage VFB. The minimum and maximum blanking frequencies may be set by the limiting lowest and highest values of the feedback voltage VFB, respectively, for example.

Figure 20:
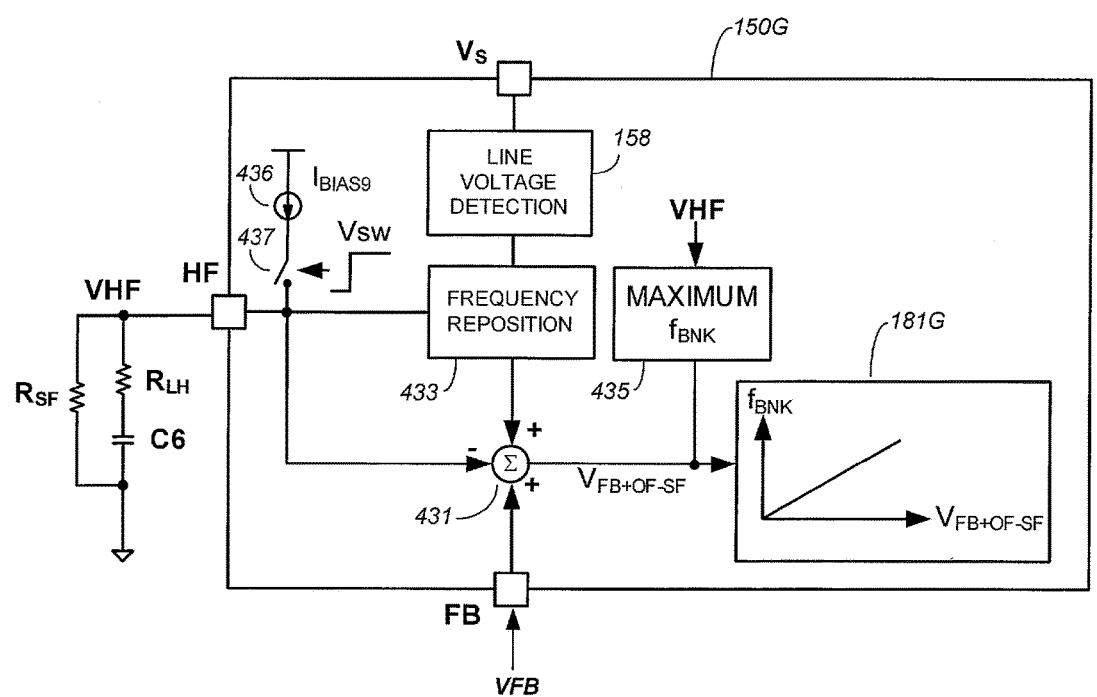
FIG. 20 shows a schematic diagram of a controller IC in accordance with another embodiment of the present invention.

FIG. 20 shows a schematic diagram of a controller IC 150G in accordance with an embodiment of the present invention. The controller IC 150G is a particular implementation of the controller IC 150 with provisions for offsetting the blanking frequency foldback curve along the y-axis to compensate for line voltage variations, shifting the blanking frequency foldback curve along the x-axis to compensate for transformer winding inductance and converter specifications, and limiting the range of the blanking frequency foldback curve as previously described. In the example of FIG. 20, to save on pin count, the controller IC 150G has a single handling frequency HF pin for programming the offset voltage, shift frequency voltage, and a blanking frequency limit.

In the example of FIG. 20, external components are connected to the HF pin to program the offset voltage VOF for offsetting the blanking frequency foldback curve along the y-axis, the shift frequency voltage VSF for shifting the blanking frequency foldback curve along the x-axis, and the high limit voltage VH for setting the maximum blanking frequency. In the example of FIG. 20, the resistor RLH is in series with a capacitor C6, and the resistor RSF is across the series circuit formed by the resistor RLH and capacitor C6. Because of the capacitor C6, the level of the handling frequency voltage VHF is different at startup and at steady-state.

In the example of FIG. 20, a current source 436 generates a bias current IBIAS9 that flows through the HF pin when a switch 437 is turned on by a switch signal VSW, which may be generated by a frequency reposition circuit 433 or other circuit of the controller IC 150G. At the instant the switch 437 is turned on, the level of the handing frequency voltage VHF is dictated by the bias current IBIAS9 and the parallel resistance of the resistors RSF and RLH, which gives the high limit voltage VH for setting the maximum blanking frequency. At steady-state after the switch 437 is turned on, the level of the handing frequency voltage VHF is dictated by the bias current IBIAS9 and the resistance of the resistor RSF, which gives the shift frequency voltage VSF for shifting the blanking frequency foldback curve to compensate for transformer winding inductance and converter specifications. The rate of increase of the handing frequency voltage VHF from startup to steady-state gives the offset voltage VOF for offsetting the blanking frequency foldback curve to compensate for variations in line voltage conditions. The rate of increase of the handing frequency voltage VHF from startup to steady-state is dictated by the bias current IBIAS9 and the capacitance of the capacitor C6.

In the example of FIG. 20, the frequency reposition circuit 433 is configured to detect the rate of increase of the handing frequency voltage VHF from startup to steady-state to generate the offset voltage VOF for adjusting the feedback voltage VFB based on line voltage conditions, as detected by the line voltage detection circuit 158. The frequency reposition circuit 433 is configured to detect the level of the handing frequency voltage VHF at steady-state to generate the shift frequency voltage VHF for adjusting the feedback voltage VFB. A summer 431 subtracts the shift frequency voltage VSF from the feedback voltage VFB and adds the offset voltage VOF to the feedback voltage VFB before providing the feedback voltage VFB to the feedback voltage input of the blanking frequency generator 181G. The blanking frequency generator 181G sets the blanking frequency based on the adjusted feedback voltage (VFB+OF−SF) in accordance with its blanking frequency foldback curve. The offsetting of the blanking frequency foldback curve along the y-axis and shifting of the blanking frequency foldback curve along the x-axis are as previously described.

Figure 21:
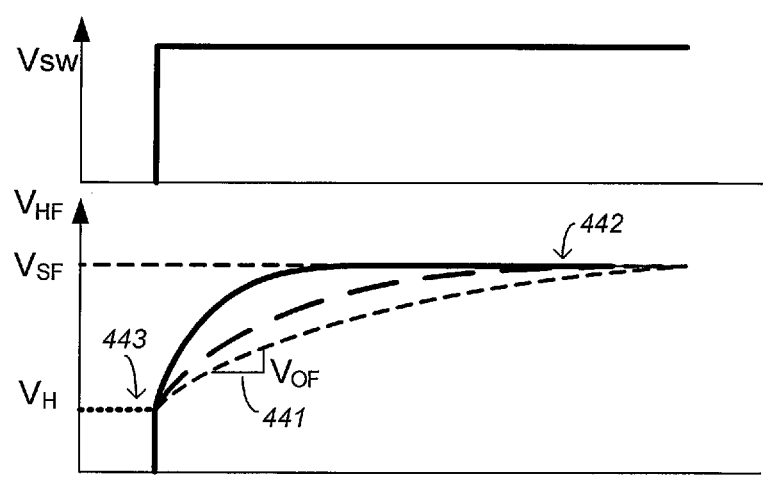
FIG. 21 shows waveforms of signals of the controller IC of FIG. 20 in accordance with an embodiment of the present invention.

FIG. 21 shows waveforms of signals of the controller IC 150G in accordance with an embodiment of the present invention. FIG. 21 shows the switch voltage VSW applied to the switch 437 and the handling frequency voltage VHF. As illustrated in FIG. 21, at the instant the switch 437 is turned on, the level of the handing frequency voltage VHF gives the high limit voltage VH (see 443) for setting the maximum blanking frequency. After the switch 437 is turned on, the bias current IBIAS9 charges the capacitor C6, thereby increasing the handling frequency voltage VHF. The rate of increase of the handing frequency voltage VHF over time (see 441) gives the offset voltage VOF. At steady-state after the switch 437 is turned on, the handling frequency voltage VHF reaches a steady-state level (see 442), which gives the value of the shift frequency voltage VSF.

Power supplies with variable blanking frequencies and method of operating the same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:
1. A power supply comprising:
   a feedback circuit that is configured to generate a feedback voltage that is indicative of a load condition of the power supply;
   a transistor that is connected to a primary winding of a transformer; and
   a controller integrated circuit (IC) comprising a first pin that is configured to receive the feedback voltage and a second pin that is configured to output a drive signal to a gate of the transistor to control a switching operation of the transistor by quasi-resonant switching,
   wherein the controller IC is configured to adjust the feedback voltage with a programming voltage to generate an adjusted feedback voltage, to turn off the transistor based on the feedback voltage, to detect a resonant ring on a node of the transistor when the transistor is turned off, to prevent the transistor from being turned on during a blanking time, to adjust the blanking time based on the adjusted feedback voltage, and to turn on the transistor based on a level of the resonant ring after expiration of the blanking time.

2. The power supply of claim 1, wherein the controller IC is configured to generate the adjusted feedback voltage by subtracting the programming voltage from the feedback voltage.

3. The power supply of claim 1, wherein the controller IC is configured to generate the adjusted feedback voltage by adding the programming voltage to the feedback voltage based on a level of a line voltage that is input to the power supply.

4. The power supply of claim 1, wherein the controller IC is configured to limit a blanking frequency that is an inverse of the blanking time.

5. The power supply of claim 4, wherein the controller IC is configured to limit the blanking frequency by limiting a level of the adjusted feedback voltage.

6. A controller integrated circuit (IC) for a power supply, comprising:
  a driver that is configured to drive a transistor that is connected to a primary winding of the power supply;
  a valley detection circuit that is configured to detect a resonant valley of a resonant ring on a primary side of the power supply when the transistor is turned off; and
  a blanking frequency generator that is configured to generate a blanking time based on a feedback signal that is indicative of a load condition of the power supply, and to adjust the feedback signal based on a level of an input line voltage to the power supply,
  wherein the controller IC is configured to turn off the transistor based on the feedback signal, to prevent the transistor from being turned on during the blanking time, and to turn on the transistor in response to detecting the resonant valley after expiration of the blanking time.

7. The controller IC of claim 6, wherein the controller IC includes a first pin, and wherein the controller IC is configured to add an offset voltage on the first pin to a voltage of the feedback signal to generate an adjusted feedback voltage, and to adjust the blanking time based on the adjusted feedback voltage.

8. The controller IC of claim 7, wherein the controller IC is further configured to subtract a shift frequency voltage from the voltage of the feedback signal to generate the adjusted feedback voltage.

9. The controller IC of claim 6, wherein the controller IC is further configured to limit a blanking frequency that is an inverse of the blanking time.

10. The controller IC of claim 9, wherein the blanking frequency is limited to a maximum blanking frequency.

11. The controller IC of claim 6, wherein the controller IC is configured to limit a blanking frequency that is an inverse of the blanking time by limiting the feedback signal.

12. A power supply comprising:
  a transformer comprising a primary winding and a secondary winding;
  a feedback circuit that is configured to generate a feedback voltage indicative of a load condition of the power supply;
  a transistor that is coupled to the primary winding of the transformer; and
  a controller that is configured to control a switching operation of the transistor in accordance with quasi-resonant (QR) switching, to detect a line voltage input to the power supply, to turn off the transistor based on the feedback voltage, to detect a resonant ring when the transistor is turned off, to prevent the transistor from being turned on during a blanking time, to adjust the blanking time based on the detected line voltage, and to turn on the transistor based on a level of the resonant ring after expiration of the blanking time.

13. The power supply of claim 12, wherein the controller is configured to turn on the transistor in response to detecting a valley of the resonant ring after expiration of the blanking time.

14. The power supply of claim 12, wherein the controller is configured to adjust the blanking time by adding an offset voltage to the feedback voltage based on the detected line voltage.

15. The power supply of claim 12, wherein the controller is configured to adjust the blanking time in accordance with a blanking frequency foldback curve that gives a setting of a blanking frequency for a detected feedback voltage, wherein the blanking frequency is an inverse of the blanking time.

16. The power supply of claim 12, wherein the controller is configured to detect the line voltage from an auxiliary winding of the transformer.

17. The power supply of claim 12, wherein the controller is configured to adjust the blanking time by subtracting a shift frequency voltage from the feedback voltage.

18. The power supply of claim 12, wherein the controller is an integrated circuit comprising a first pin for receiving a first external component for generating an offset voltage for adjusting the blanking time, a second pin for receiving a second external component for generating a shift frequency voltage for further adjusting the blanking time, and a third pin for receiving a third external component for limiting a blanking frequency that is an inverse of the blanking time.

19. The power supply of claim 12, wherein the controller is an integrated circuit comprising a plurality of pins, and a single pin among the plurality of pins is connected to a plurality of external components for generating an offset voltage that is added to the feedback voltage to adjust the blanking time and for generating a shift frequency voltage that is subtracted from the feedback voltage to further adjust the blanking time.

20. The power supply of claim 19, wherein the external components connected to the single pin set a limit on a blanking frequency that is an inverse of the blanking time.

* * * * *